United States Patent [19]
Kochi

[11] Patent Number: 5,721,596
[45] Date of Patent: Feb. 24, 1998

[54] LIQUID CRYSTAL DISPLAY DEVICE

[75] Inventor: Tetsunobu Kochi, Hiratsuka, Japan

[73] Assignee: Canon Kabushiki Kaisha, Tokyo, Japan

[21] Appl. No.: 712,265

[22] Filed: Sep. 11, 1996

[30] Foreign Application Priority Data

Sep. 14, 1995 [JP] Japan ................... 7-236860

[51] Int. Cl.⁶ .................... G02F 1/136; G02F 1/333; H01L 29/04; H01L 27/01
[52] U.S. Cl. .................... 349/42; 349/138; 257/59; 257/347
[58] Field of Search ............ 349/42, 138; 257/59, 257/347, 350

[56] References Cited

U.S. PATENT DOCUMENTS

| | | | |
|---|---|---|---|
| 4,907,053 | 3/1990 | Ohmi | 257/347 |
| 4,936,930 | 6/1990 | Mizutani | 257/66 |
| 5,079,607 | 1/1992 | Sakurai | 257/350 |
| 5,135,300 | 8/1992 | Toide et al. | 353/31 |
| 5,359,219 | 10/1994 | Hwang | 257/350 |
| 5,426,526 | 6/1995 | Yamamoto et al. | 349/42 |

FOREIGN PATENT DOCUMENTS

| | | |
|---|---|---|
| 0412921 | 2/1991 | European Pat. Off. . |
| 4102954 | 8/1991 | Germany . |
| 4-146628 | 5/1992 | Japan .................... 257/351 |
| 4178624 | 6/1992 | Japan . |

Primary Examiner—William L. Sikes
Assistant Examiner—Toan Ton
Attorney, Agent, or Firm—Fitzpatrick, Cella, Harper & Scinto

[57] ABSTRACT

An active matrix liquid crystal display device has a semiconductor substrate on which a plurality of pixel (including a plurality of pixel transistors and a plurality of pixel electrodes) arranged at positions determined by a plurality of data bus lines and a plurality of scanning bus lines, a counter substrate provided opposite the pixel electrodes, and a liquid crystal material provided between the semiconductor substrate and the counter substrate. Semiconductor regions having a conductivity opposite that of the semiconductor substrate are formed under the pixel transistors with an insulating film provided therebetween, such that a potential of the semiconductor regions, varies, e.g., is time dependant.

20 Claims, 11 Drawing Sheets

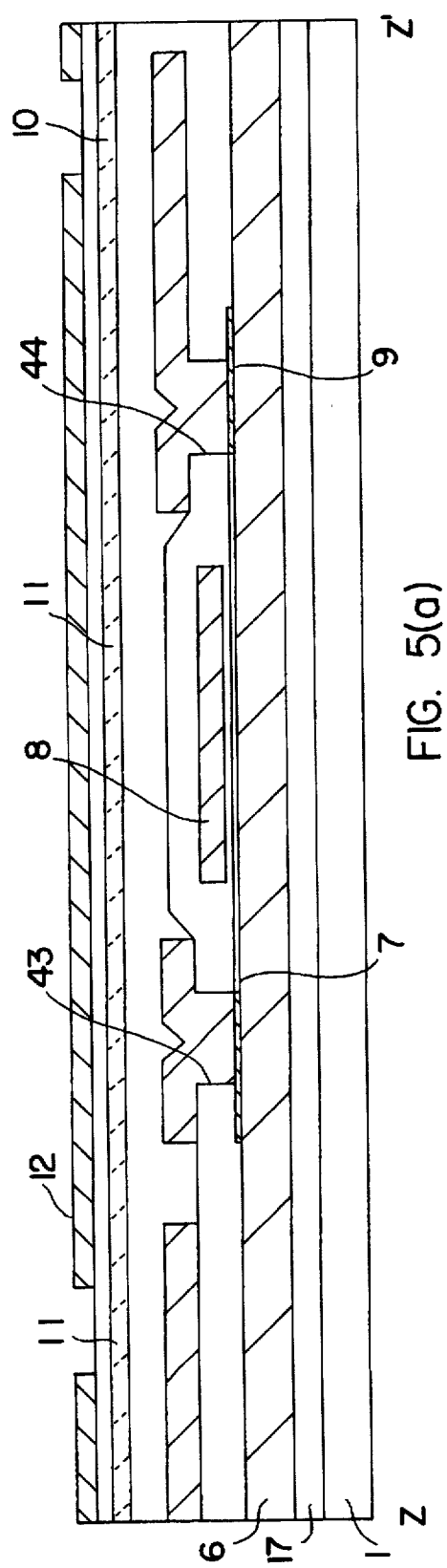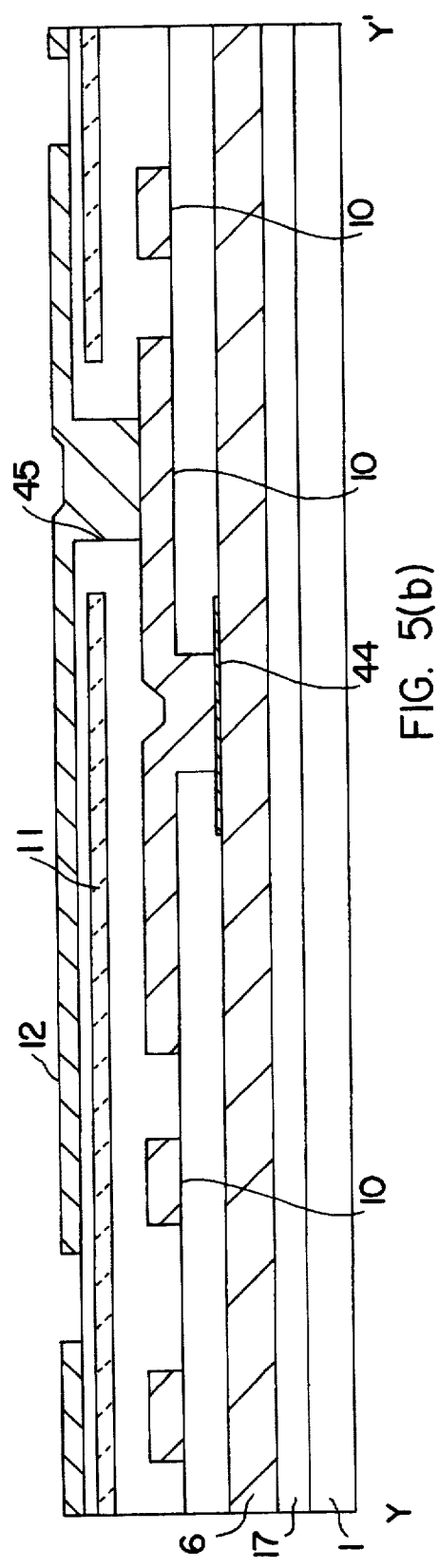
FIG. 5(a)
FIG. 5(b)

LIQUID CRYSTAL DISPLAY DEVICE

BACKGROUND OF THE INVENTION

1. Field of the Invention

The present invention relates to liquid crystal display devices, and particularly, to liquid crystal display devices for displaying video information such as characters, still pictures, and motion pictures.

2. Description of the Related Art

Recently, equipment called multimedia units, by which users can readily handle video information, have been developed and utilized. In such equipment, protective display devices using a liquid crystal panel are included. This type of equipment recently has been in high demand to enable high definition displays. Accordingly, reflective liquid crystal panels are being actively researched, in addition to transmissive liquid crystal panels, which already have been widely used, because these reflective panels and transmissive panels can be viewed directly. For example, as reported in a publication titled "2-in. MOS-NCAO Reflective Light Valve for VGA Projector", Technical Report of IEICE (the Institute of Electronics, Information and Communication Engineers in Japan), EID94-77, 97-101(1994), written by T. Nagata, et al., a projective display device that uses a reflective panel in which bulk transistors are utilized as pixel transistors is known.

Among liquid crystal panels, an active matrix type in which a plurality of pixels are provided with respective pixel transistors is dominant. These pixel transistors are preferably fine and highly responsive. Such pixel transistors are classified into two types: a type in which gate electrodes are disposed above channels with an insulating film provided therebetween; and an inverse stagger type in which gate electrodes are disposed below channels with an insulating film provided therebetween. An inverse stagger type transistor uses, as a gate electrode, a diffusion region formed below a channel with an insulating layer provided therebetween, e.g., as disclosed in U.S. Pat. No. 4,396,930.

However, in such conventional types of pixel transistors, when a video signal is written into the pixels, backgate effects cause a shift in the threshold voltage of the pixel transistors, and as a result, the video signal cannot be sufficiently written into the pixels. Also, in order to achieve writing characteristics, the gate-on voltage of the pixel transistors needs to be further increased. This additional increase causes an increase in the supply voltage for the overall liquid crystal panel, which in turn deteriorates the reliability of the pixel transistors. Further, since it is required that the pixel transistors have a high tolerance voltage, the pixel size or the panel size cannot be readily reduced and the resolution cannot be enhanced. In addition, the power consumption increases due to the high supply voltage requirements. These defects significantly increase the cost.

SUMMARY OF THE INVENTION

An object of the present invention is to provide a high-definition liquid crystal display device which has a simplified structure, low power consumption, low cost due to high yield, and greater durability due to improved reliability.

In one aspect, the present invention relates to an active matrix liquid crystal display device including a semiconductor substrate on which a plurality of pixels are arranged at positions determined by a plurality of data bus lines and a plurality of scanning bus lines. Each pixel includes a pixel transistor and a pixel electrode, where the pixel transistor is located adjacent a respective pixel electrodes, between the semiconductor substrate and this respective pixel electrode. The display device further includes a counter substrate provided opposite the pixel electrodes, and a liquid crystal material provided between the semiconductor substrate and the counter substrate. A semiconductor region is formed between the pixel transistors and the semiconductor substrate with an insulating film provided therebetween. The semiconductor region has a conductivity opposite that of the semiconductor substrate, and an electric potential of the semiconductor region is variable, e.g., time depended.

Preferably, the semiconductor region includes a plural subregions that are connected to each other.

In part of the semiconductor region secondary semiconductor regions (subregions) whose concentration is higher than that of primary semiconductor regions (subregions) may be formed.

The secondary semiconductor regions may have the same polarity as that of the primary semiconductor regions.

In another aspect, the semiconductor substrate may comprise an image display portion in which the pixel transistors, the pixel electrodes and the semiconductor regions are provided, and a peripheral driving circuit portion for driving the image display portion, the semiconductor regions and the peripheral driving circuit portion are not connected to each other.

At least parts of the semiconductor regions may be mutually connected with each other in a direction parallel to the scanning bus lines, and may be separated from each other in the direction perpendicular to the scanning bus lines.

The semiconductor regions may be connected to the scanning bus lines.

The semiconductor regions may be connected to the scanning bus lines for each of a predetermined plurality of pixels, or for each pixel.

In another aspect, the present invention relates to an active matrix liquid crystal display device including an active matrix substrate on which a plurality of pixels are arranged at positions determined by a plurality of data bus lines and a plurality of scanning bus lines, a counter substrate provided opposite the respective pixel electrodes of the plurality of pixels, and a liquid crystal material provided between the active matrix substrate and the counter substrate, wherein second scanning bus lines are disposed under the pixel transistors with an insulating film provided therebetween.

Preferably, the base of the active matrix substrate comprises a semiconductor substrate, and the second scanning bus lines have a conductivity opposite that of the semiconductor substrate.

The second scanning bus lines may be connected to the scanning bus lines for each of a predetermined plurality of pixels or for each pixel.

In accordance with the present invention, the semiconductor regions having a conductivity opposite that of a semiconductor substrate are formed under the thin film transistors (referred to as the "TFTs" hereinafter) with an insulating film provided therebetween. Therefore the electric potential of the TFTs can be controlled. The semiconductor regions having a conductivity opposite that of the semiconductor substrate form p-n junctions that prevent electric noise generated in the image display portion from being transmitted to the peripheral driving circuit portion. Electric noise generated in the peripheral driving circuit is not transmitted to the image driving circuit.

In accordance with the present invention, second scanning bus lines are disposed under pixel transistors with an insulating film formed therebetween in an active matrix liquid crystal device that includes an active matrix substrate on which the pixel transistors and pixel electrodes are arranged at the positions determined by a plurality of data bus lines and a plurality of scanning bus lines, a counter substrate provided opposite the pixel electrodes, and a liquid crystal material provided between the active matrix substrate and the counter substrate. This arrangement enhances characteristics of the pixel transistors. In addition, even if a scanning bus line breaks, a second scanning bus lines is used instead. The second scanning bus lines contribute to an increased yield rate and improved durability.

As described above, in accordance with the present invention, the whole liquid crystal panel has high resolution and a simplified structure. Further, production costs can be reduced because of an increased yield rate. The durability of the panel lengthens, and the power consumption can be reduced.

BRIEF DESCRIPTION OF THE DRAWINGS

FIGS. 5A and 5B are cross sections of the enlarged plan view in FIG. 4, taken on line Z-Z' and line Y-Y', respectively.

DESCRIPTION OF THE PREFERRED EMBODIMENTS

Four different liquid crystal panels according to embodiments of the present invention will be described below. The present invention however is not limited to the respective embodiments. Advantages of the present invention are enhanced by combining techniques used in these embodiments. The structures of liquid crystal panels in which semiconductor substrates are used are described, however, the structures are not limited to such substrates. The structures disturbed below may be formed on a conventional transparent substrate. All liquid crystal panels described below are a TFT-type; however, the panels may be a two-terminal type such as a diode-type. The liquid crystal panels described below may be applied to various display devices, e.g., home televisions, projectors, head-mount displays, three-dimensional video game equipment, lap-top computers, electronic pocketbooks, television conference systems, car navigators, and cockpit panels.

Embodiment 1

Figure 1:
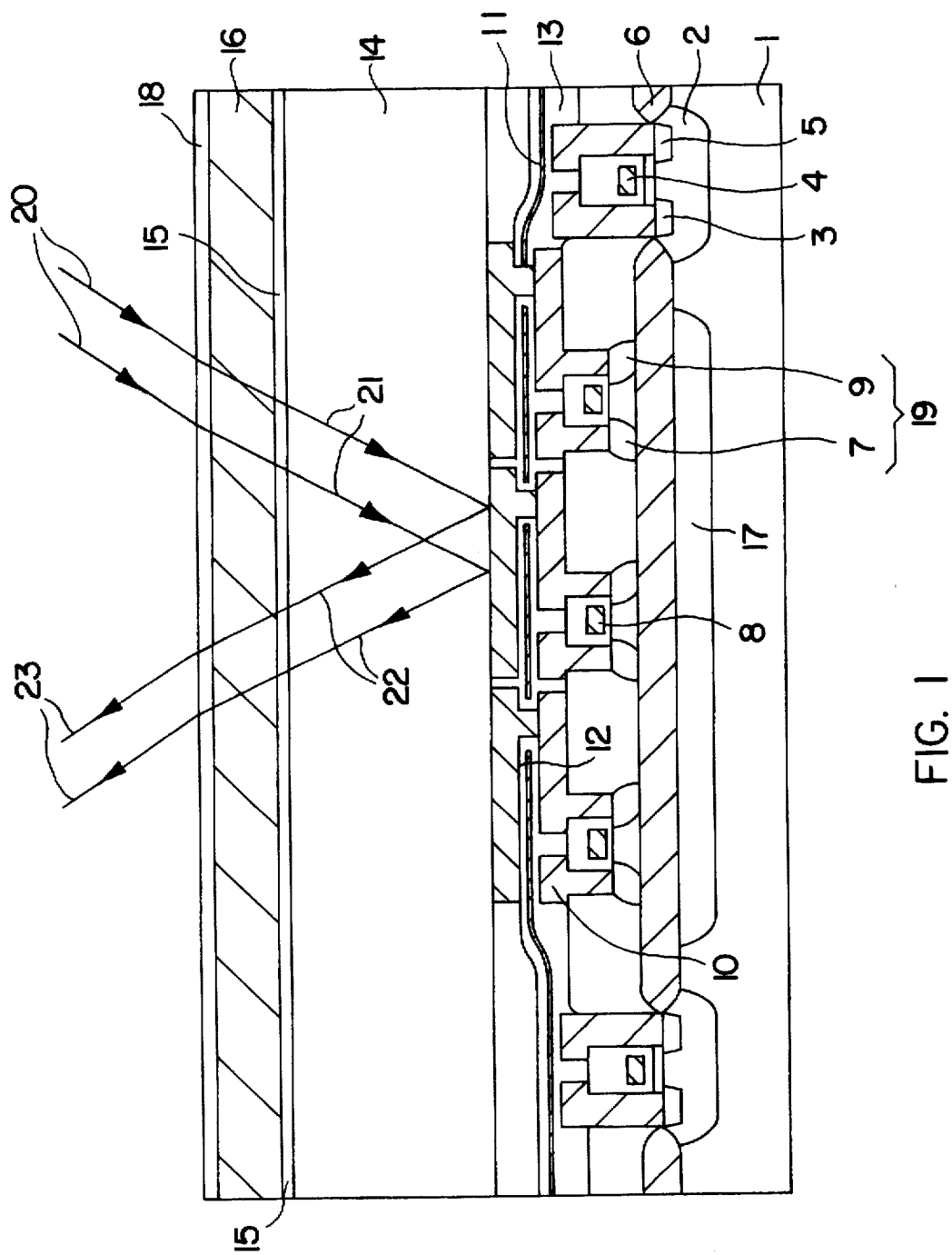
FIG. 1 is a cross section of a liquid crystal panel in accordance with embodiment 1 of the present invention.

Semiconductor regions having a conductivity opposite to that of a semiconductor substrate are formed only below an image display portion. FIG. 1 is a section view showing the basic structure of a reflective liquid crystal panel. This reflective liquid crystal panel has a semiconductor substrate 1, well regions 2, sources 3 of metal-oxide semiconductor field-effect transistors (MOS FETs), gates 4 of the MOS FETs, drains 5 of the MOS FETs, a field oxide film 6, sources 7 of TFTs functioning as pixel transistors, gates 8 of the TFTs, drains 9 of the TFTs, metallic leads 10, a light-shielding layer 11, a pixel reflection electrode 12, a passivation layer 13, a liquid crystal material 14, a common transparent electrode 15, a counter transparent substrate 16, a diffusion layer 17 which constituted semiconductor region having a conductivity opposite that of the semiconductor substrate 1, an anti-reflection layer 18, pixel transistors 19 (each including a source 7, a gate 8, a drain 9 and metallic leads 10), and optical paths 20, 21, 22 and 23.

Parallel rays along an optical path 20 from the outside are incident on the anti-reflection layer 18 formed on the counter transparent substrate 16. The anti-reflection layer 18 allows the incident rays to pass though it without reflecting them. The rays travel into the liquid crystal material 14, along the optical path 21. The rays are reflected by the pixel reflection electrode 12, along the optical path 22. The rays travel from the liquid crystal panel to the outside, along the optical path 23. In this condition, by applying a voltage between the pixel reflection electrode 12 and the common transparent electrode 15, the diffusion coefficient of the liquid crystal material 14 changes. This change in the diffusion coefficient causes the rays along the optical path 23 to have a light intensity that varies in accordance with a video signal. A component reflected at one surface of the counter transparent substrate 16 is suppressed by the anti-reflection layer 18. Thus, no reflection light travels into the liquid crystal material 14. By using polycrystal silicon that is extremely thin, e.g., 100 to 1000 Å, for the pixel transistors and using bulk monocrystal silicon in a peripheral driving circuit portion, the liquid crystal panel can be driven at a high speed, and high definition display with several hundred thousands to several millions of pixels can be realized.

Figure 2:
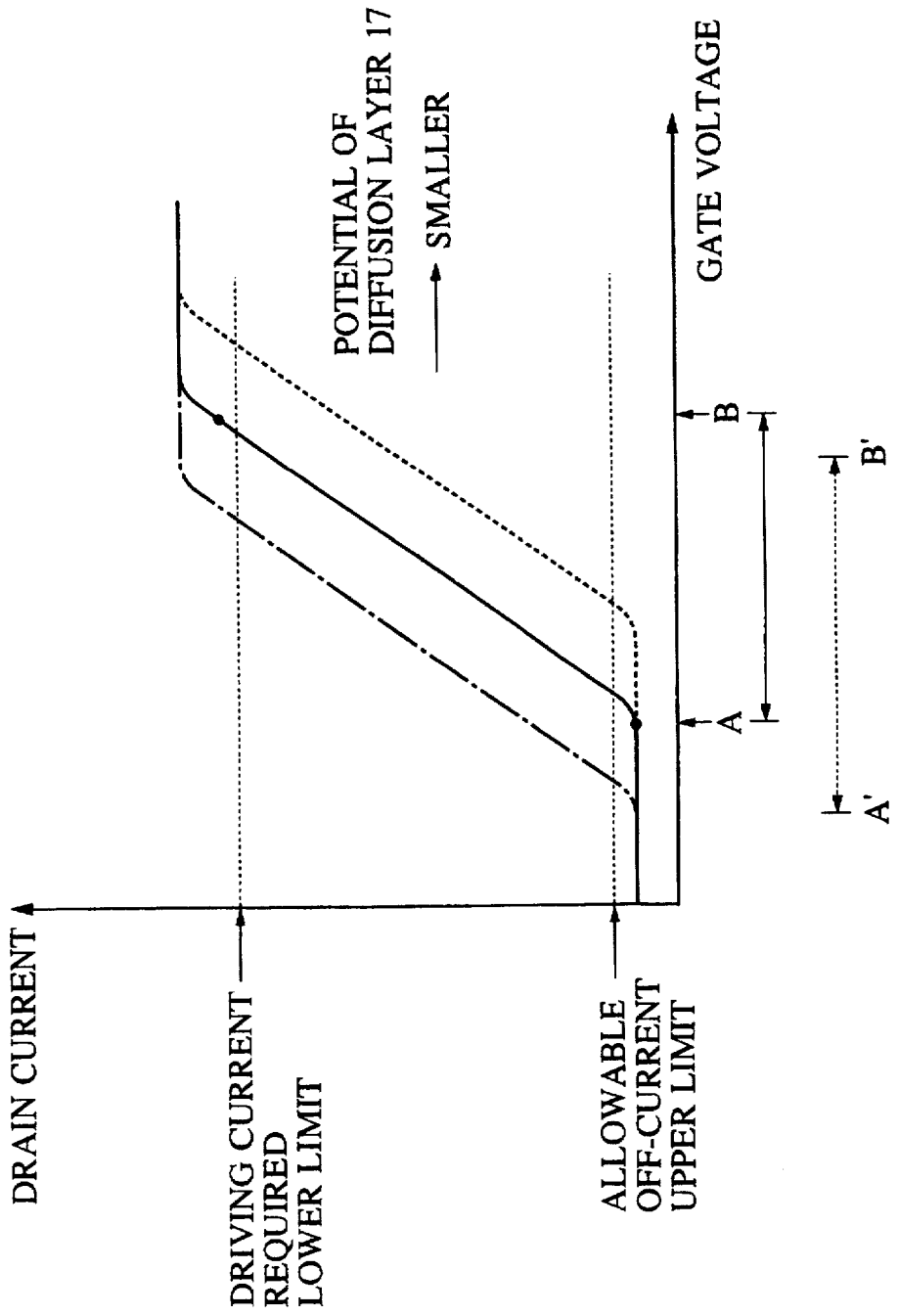
FIG. 2 is a graph showing the voltage-versus-current characteristics of TFTs used in the liquid crystal panel according to embodiment 1.

FIG. 2 illustrates changes in the electric current-versus-voltage characteristics of the TFTs 7 to 9 when the electric potential of the diffusion layer 17 is changed. Although the TFTs 7 to 9 illustrated in FIG. 2 are n-channel type, they may be p-channel type. It is understood from FIG. 2 that changing the potential of the diffusion layer 17 enables the threshold voltage of the TFTs to be shifted. Therefore, it is possible to readily specify an appropriate leak current obtained when the TFTs are switched off and an appropriate driving current obtained when the TFTs are switched on. In other words, by controlling the potential of the diffusion layer 17 so that the leak current is necessarily and sufficiently suppressed, at the off-voltage of the gate (as represented by point A in FIG. 2), the on-voltage of the gate (as represented by point B in FIG. 2) does not need to be excessively increased. Thereby, the voltage of the whole liquid crystal panel can be reduced, which thus decreases the power consumption. Consequently, the transistors do not need to have a high tolerance voltage, or may be designed to have a simplified structure, which enables a reduction in the size of the panel thereby reducing the cost. In addition, the TFTs can be readily miniaturized (made fine) to provide a high definition display panel. The reliability of the circuit is enhanced to provide a panel having high durability.

Further, changes in the TFT characteristics, caused by changes in production conditions, can be suppressed by finely controlling the potential of the diffusion layer 17. Thereby, the yield rate increases to enable reduction in the panel size and the costs.

P-n junctions are formed between the semiconductor substrate 1 and the semiconductor regions having a conductivity opposite that of the semiconductor substrate 1. The p-n junctions prevent electric noise generated in an image display portion from being transmitted to the semiconductor regions having a conductivity opposite to that of the semiconductor substrate. In reverse, the p-n junctions prevent electric noise generated in the peripheral driving circuit portion from being transmitted to the image display portion. Since the diffusion layer 17 can be formed in the same process as for the well regions 2 in the peripheral driving circuit portion, no steps are added in the process.

When a video signal is inverted in each field period, the potential of the diffusion layer 17 is changed in accordance with the period, so that the leak current of the pixel transistors can be reduced. Inverting the video signal in each field period means switching the video signal to a high potential signal and a low potential signal before writing the signals into each pixel. When the video signal of high potential is written, the potential of the diffusion layer 17 is set to a high voltage so that a high driving current flows in the on status, in accordance with the inversion of the video signal in each field. When the video signal of low potential is written, the potential of the diffusion layer 17 is set to a low voltage so that the leak current is sufficiently suppressed to a small value, in accordance with the inversion of the video signal in each field.

By controlling the potential of the semiconductor regions used in the present invention in accordance with the temperature characteristics of the pixel transistors, with the temperature monitored, image display of higher quality can be created.

Embodiment 2

Figure 4:
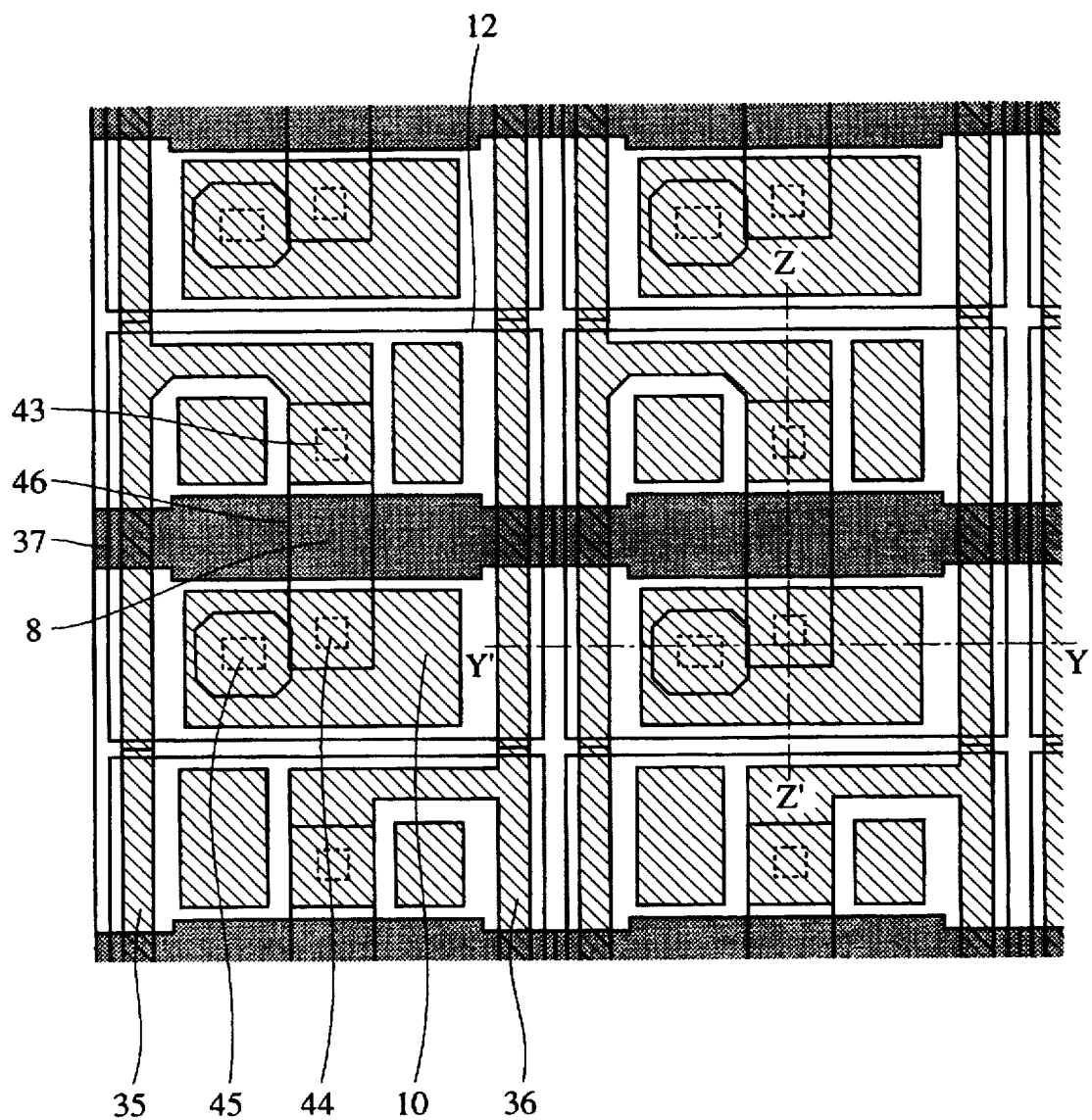
FIG. 4 is an enlarged plan view of a liquid crystal panel in accordance with embodiment 2 of the present invention.
Figure 6:
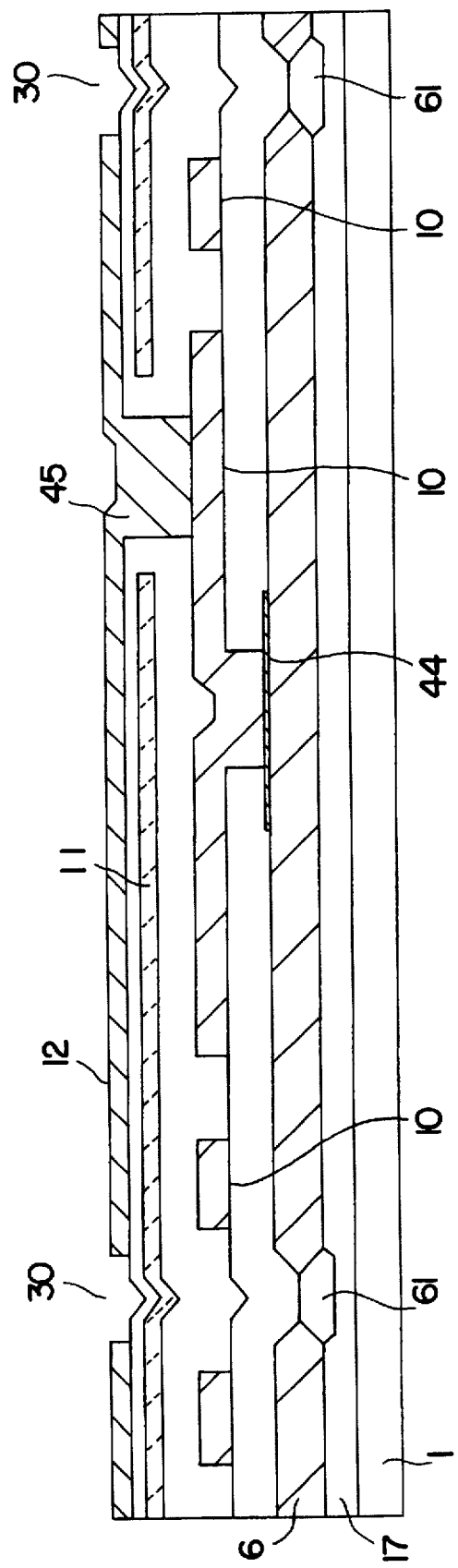
FIG. 6 is a cross section of the liquid crystal panel in accordance with embodiment 2.

High concentration impurity regions are formed in the diffusion layer 17. FIG. 4 is a plan view of a plurality of pixels in a liquid crystal panel, gates 8 of the pixel transistors, data bus lines 35 and 36, scanning bus lines 37, contact areas 43 in which the source regions and source electrodes of TFTs come into contact with each other, contact areas 44 in which the drains and drain electrodes of the TFTs come into contact with each other, contact areas 45 in which the drain electrodes and pixel reflection electrodes 12 come into contact with each other, monocrystal silicon areas 46 forming the sources, channels and drains of the TFTs. FIG. 6 is a cross section of the liquid crystal panel, taken on line Y-Y' in FIG. 4. The liquid crystal panel includes high concentration impurity regions 61 that have the same conductivity as diffusion layer 17. Reference numerals that are the same as those in embodiment 1 denote the same regions, elements or parts, and the explanation thereof will be omitted. These high concentration impurity regions 61 cause the diffusion layer 17 to have low resistance and stable potential, which thus enables a more stable operation of the TFTs. Preferably, the impurity regions 61 are formed under the pixel electrode interface 30, as shown in FIG. 6. In the liquid crystal display device according to Embodiment 2, selective oxidation in the process of forming the peripheral driving circuit portion forms areas in which silicon regions are exposed when observed from the surface. The impurity regions 61 are formed by ion implantation in the process of forming the sources and drains of transistors in the peripheral driving circuit portion. Accordingly, without changing any steps of the production process, the above-described structure can be produced to enable a more stable operation of the TFTs.

By forming indentations or hollows on a field oxide film 6 in the selective oxidation process, a light-shielding layer 11 formed in the gaps between the respective pixel reflection electrodes 12 can be provided with similar hollows, as shown in FIG. 6. In other words, the shielding layer 11 in the gaps between the pixel reflection electrodes 12 can be disposed at a different angle with respect to the pixel reflection electrodes 12. In this arrangement a reflected component of noise light that travels into the gaps between the pixel reflection electrode 12 is completely separated from a reflected component by the pixel reflection electrode 12, and the separated component does not travel into the projection optical system. These effects enable higher contrast display.

Embodiment 3

Figure 7:
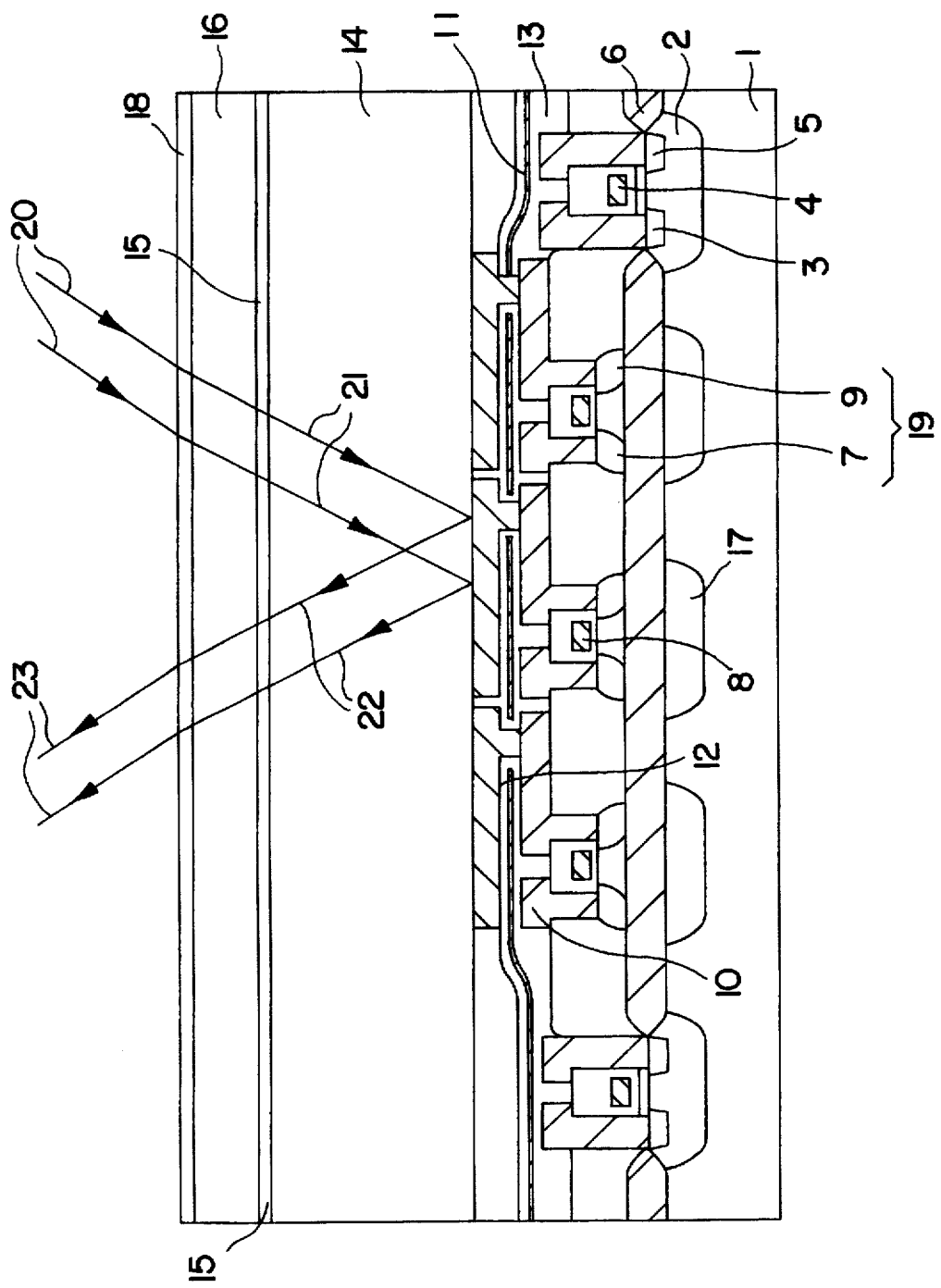
FIG. 7 is a cross section of a liquid crystal panel in accordance with embodiment 3.
Figure 8:
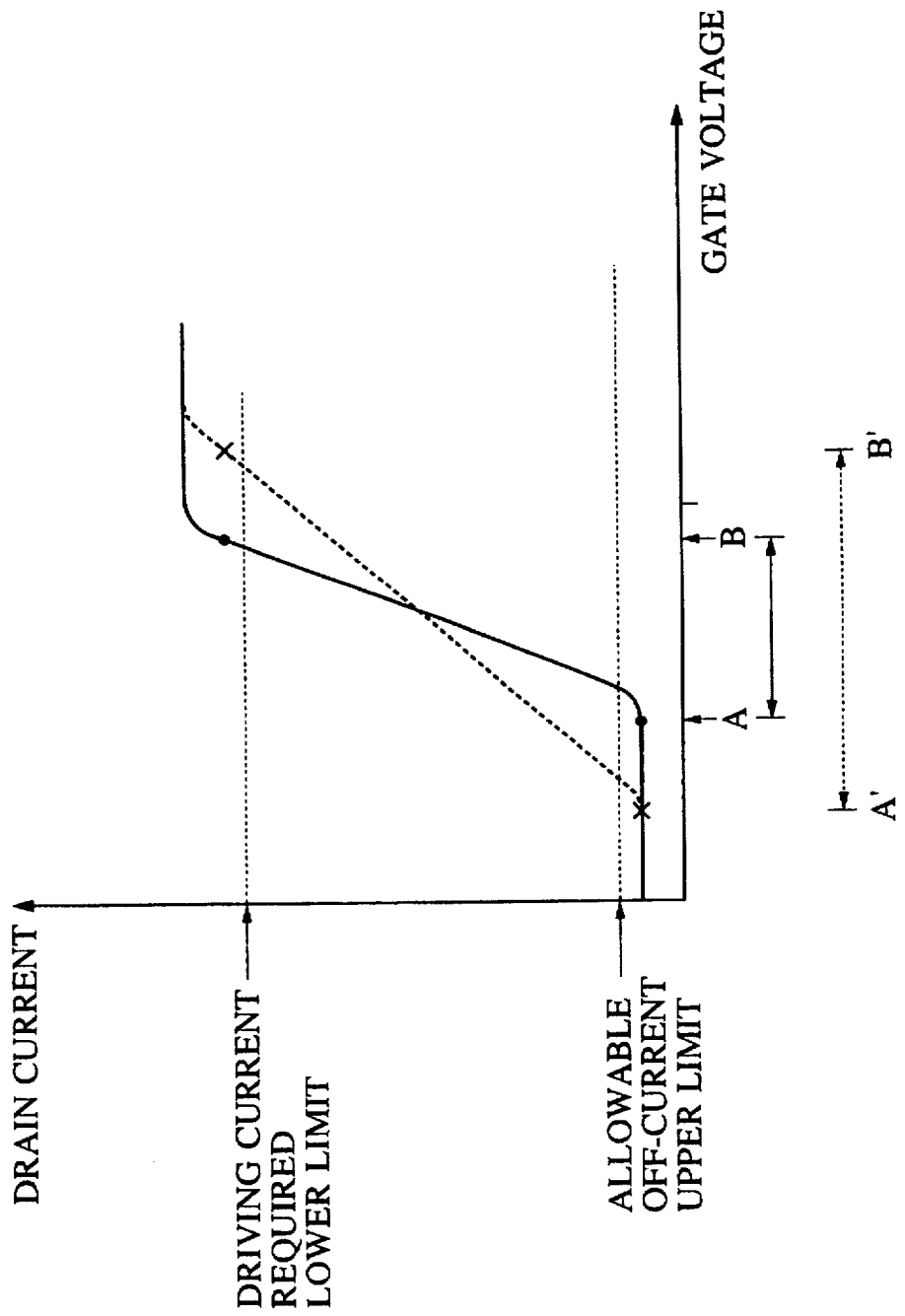
FIG. 8 is a graph showing the voltage-versus-current characteristics of TFTs used in the liquid crystal panel according to embodiment 3.

A liquid crystal device according to Embodiment 3 of the present invention includes a plurality of separate stripe-shaped diffusion layers corresponding to respective pixel rows under the TFTs. The separated diffusion layers are connected to scanning bus lines, and are arranged parallel thereto. FIG. 7 is a section view of a plurality of pixels of the reflective liquid crystal device according to Embodiment 3. Reference numerals that are the same as those in the above figures denote the same regions, elements or parts, and the explanation thereof will be omitted. As can be seen, separate diffusion layers 17 are illustrated extending in a direction perpendicular to the plane of the sheet of FIG. 7. For example, on the assumption that a semiconductor substrate is n-type, TFTs 19 serving as pixel transistors are n-channel type, and the separate diffusion layers 17 are p-type, the voltage of the gates 8 of the TFTs and the voltage of the diffusion layers 17 are changed at the same time. FIG. 8 is a graph showing the voltage-versus-current characteristics of the TFTs 19. A solid line represents the characteristics when the voltages of the gates 8 and the diffusion layers 17 are changed at the same time, while a broken line represents the characteristics when only the voltage of the gates 8 is changed. The voltage of the diffusion layers 17 under the TFTs 19 changes such that the threshold voltage decreases due to an application of a high voltage when the gates are switched on, while the threshold voltage increases when the gates are switched off. As a result, a rapid change occurs in the voltage-versus-current characteristics of the TFTs, as represented by the solid line. This rapid change causes a reduction in the leak voltage to enable image display having enhanced contrast. In addition, the liquid crystal device according to Embodiment 3 enables a reduction in the parasitic capacity of the scanning bus lines, which thus reduces crosstalk generated therefrom.

Embodiment 4

Figure 9:
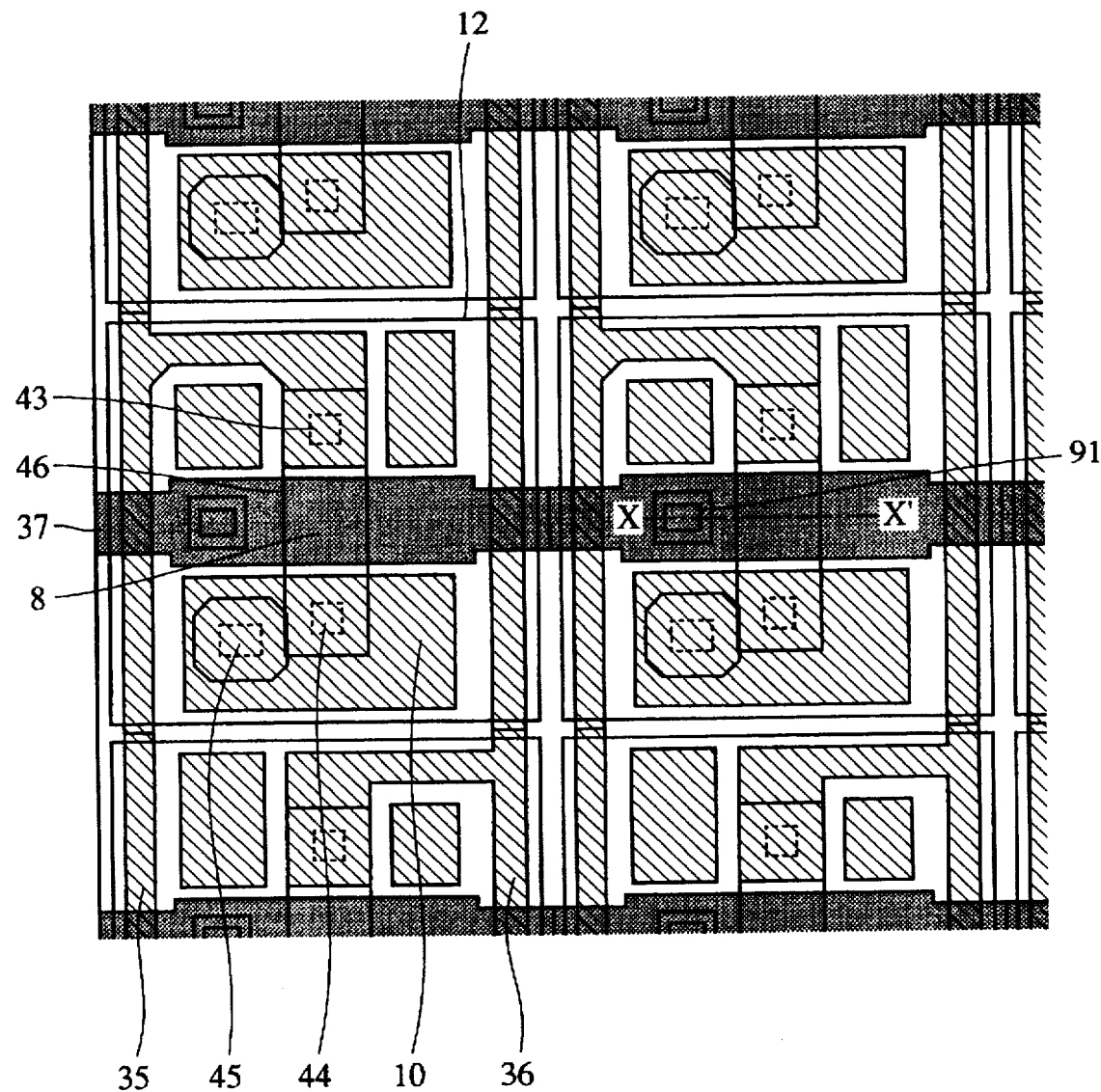
FIG. 9 is a plan view of a liquid crystal panel in accordance with embodiment 4 of the present invention.
Figure 10:
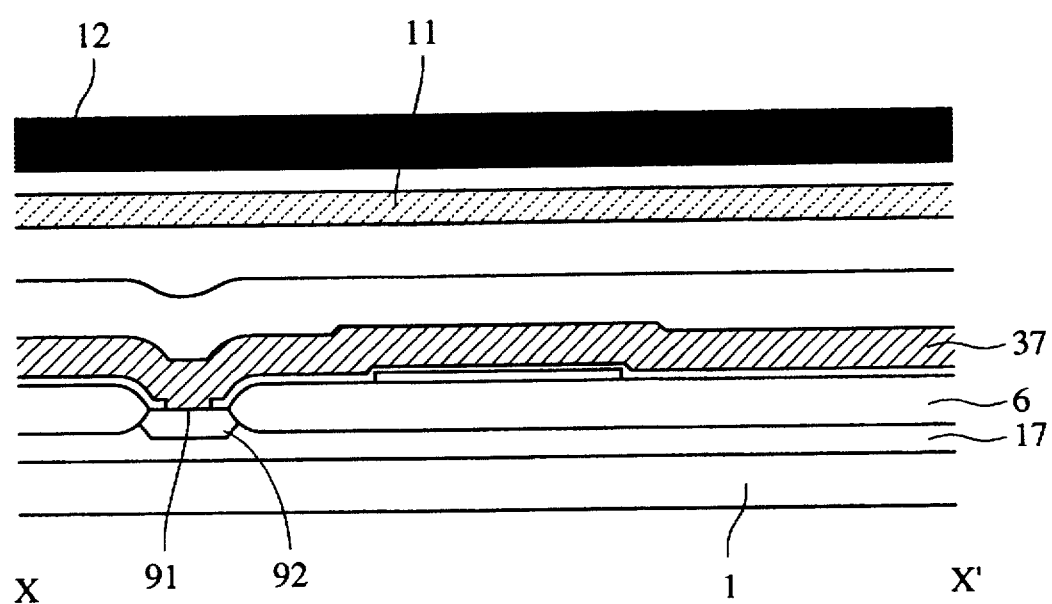
FIG. 10 is a cross section of the liquid crystal panel according to embodiment 4.

A liquid crystal device according to Embodiment 4 of the present invention has a plurality of separate stripe-shaped diffusion layers corresponding to respective pixel rows under the TFTs, similar to Embodiment 3. The separate diffusion layers 17 are connected to scanning bus lines, and are arranged parallel thereto. In Embodiment 4, the scanning bus lines and the separate diffusion layers 17 differs from those in Embodiment 3 in that they are connected to each other in the respective pixels. FIG. 9 is a plan view of the liquid crystal device according to Embodiment 4. FIG. 10 is a cross section of the device, taken on line X-X' in FIG. 9. There are shown contact holes 91 by which a scanning bus line 37 and adjacent separate diffusion layers 17 are connected to each other; a high concentration impurity region 92 electrically connects the adjacent separate diffusion layers 17 to the scanning bus lines 37. The high concentration impurity region 92 may be formed by using ion implantation or by diffusing impurities from polycrystal silicon after using the polycrystal silicon to form the scanning bus lines 37. The scanning bus lines 37 may comprise conductors made of silicide such as TiSi and WSi or metallic conductors such as Al and Cu. The scanning bus lines 37 and the separate diffusion layers 17 may be connected to each other in each pixel or for each of a predetermined plurality of pixels.

In Embodiment 4, the scanning bus line 37 and the separated diffusion layer 17 are connected by the high concentration impurity region 92 through contact holes 91. Therefore, this arrangement causes an increase in redundancy which counters any breaking of the scanning bus lines 37, and decreases the series resistance of the separated diffusion layers 17.

EXAMPLES OF THE INVENTION

Example 1

Figure 3:
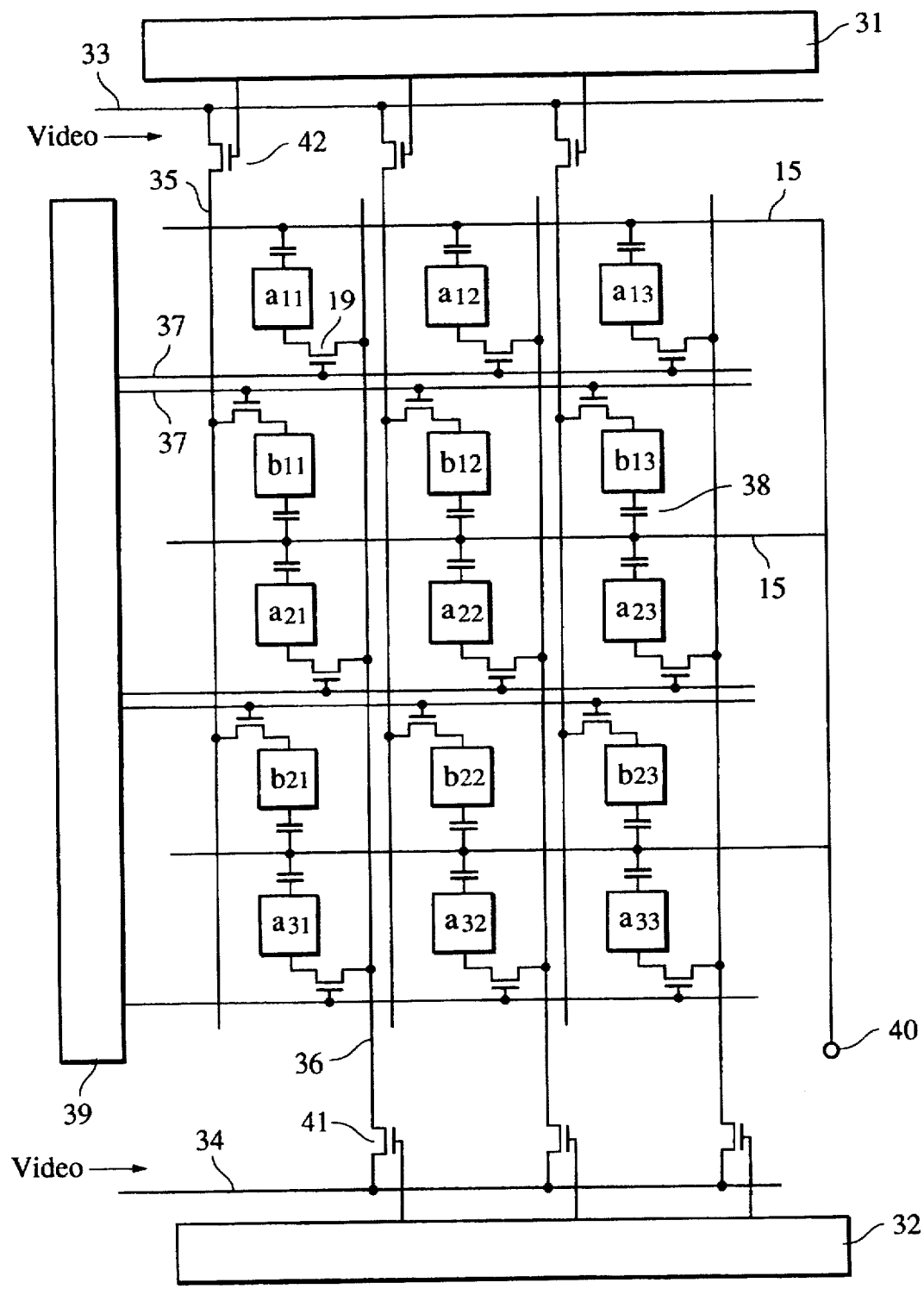
FIG. 3 is a circuit diagram of a liquid crystal panel in accordance with use example 1 of the present invention.

Example 1 is a liquid crystal panel according to present invention, which employs a driving system having two data bus lines in each column. FIG. 3 is a circuit diagram of a liquid crystal panel including a plurality of pixels (all ... a33, b11 ... b33), horizontal shift registers 31 and 32, video signal lines 33 and 34, data bus lines 35 and 36, scanning bus lines 37, holding capacitors 38, a vertical shift register 39, a common electrode terminal 40, and transfer switches 41 and 42. Reference numerals that are the same as those in the above figures denote the same regions, elements or parts, and the explanation thereof will be omitted. In this example, a video signal is read from a frame memory. In connection with the read video signal amplification, gamma correction and polarity inversion are performed, and the resulting signal is outputted to the video signal lines 33 and 34. In other words, a non-interlace signal corresponding to two pixel rows is read from the frame memory. The odd row signal and the even row signal are outputted to the video signal line 33 and the video signal line 34, respectively.

The horizontal shift registers 31 and 32 perform sampling of the input video signal. As shown in FIG. 3, odd pixel rows and even pixel rows are arranged without the pixel rows shifted, which enables the sampling using the same pulses. Accordingly, field-through noise generated from other pulses are not included in the sampled signals, and as a result, preferred image display can be realized. Further, even non-interlace driving enables simultaneous writing in two pixel rows such as the first and second pixel rows, or the third and fourth pixel rows. Therefore, one half of a conventional horizontal scanning frequency is sufficient for the operation of the liquid crystal panel. In particular, the greater the number of pixels, the higher the frequency for sampling the pixels. As the frequency becomes higher, the driving performance of sampling transistors 41 and 42 becomes enhanced. Therefore, this example shows remarkable advantages, compared with a conventional example using large-size transistors. FIG. 4 is a plan view of a panel illustrated by the circuit diagram in FIG. 3. On the right and left of each column there are provided column data bus lines for odd and even pixel rows. In this example, without enlarging the size of the liquid crystal panel, the size of the peripheral driving circuit portion can be reduced compared with that of a conventional peripheral driving circuit portion, and as a result, the overall size of the liquid crystal panel can be reduced, and production cost for the panel can be reduced.

By providing a semiconductor substrate and a diffusion layer having a conductivity opposite that of the semiconductor substrate below the TFTs, the TFTs can be stably operated. FIG. 5A is a cross section taken on line Z-Z' in the liquid crystal panel shown by FIG. 4. FIG. 5B is a cross section takgn onnine Y-Y' in the panel shown by FIG. 4. The panel is the same as that in use Example 1. A semiconductor substrate 1 comprises an n-type semiconductor in which the concentration of impurities is $1 \times 10^{14}$ to $1 \times 10^{17}$ [cm$^{-3}$]. A p-type diffusion layer 17 is formed by ion implantation of boron ions. The concentration of impurities in this p-type diffusion layer 17 is $1 \times 10^{15}$ to $1 \times 10^{17}$ cm$^{-3}$. This diffusion layer 17 causes TFTs 7, 8 and 9 to be stably operated. On the diffusion layer 17 a field-oxide layer 6 is formed by a selective oxide layer. On the field-oxide layer 6 the TFTs comprising polycrystal silicon are formed.

Example 2

Figure 11A:
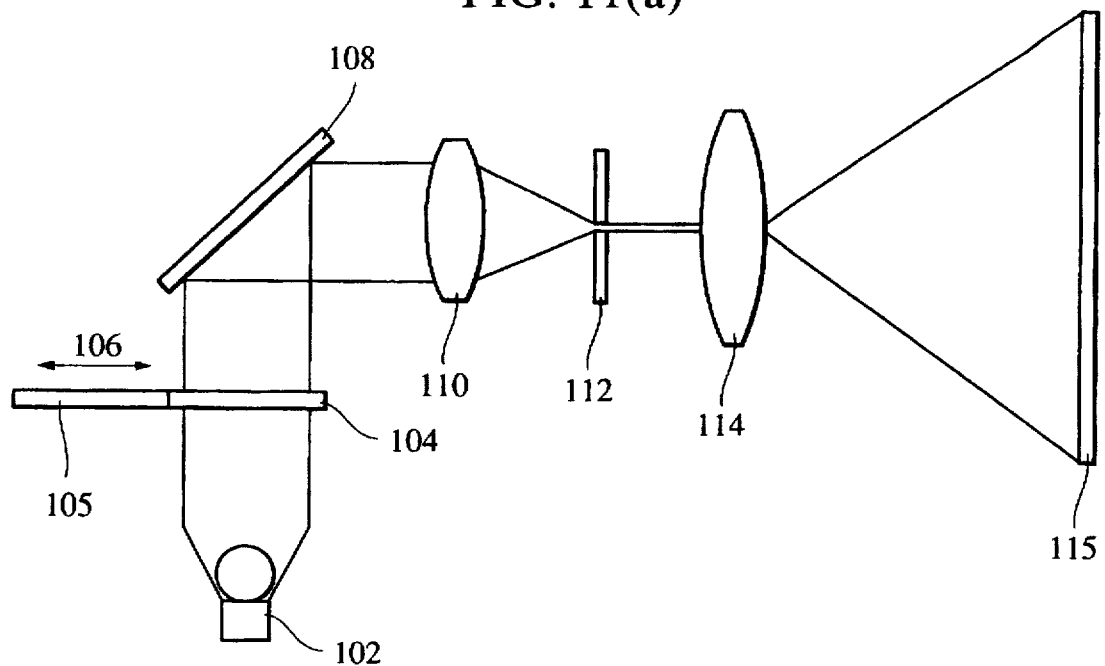
FIGS. 11A and 11B are schematic charts illustrating an optical system of a projector in accordance with use example 2.
Figure 11B:
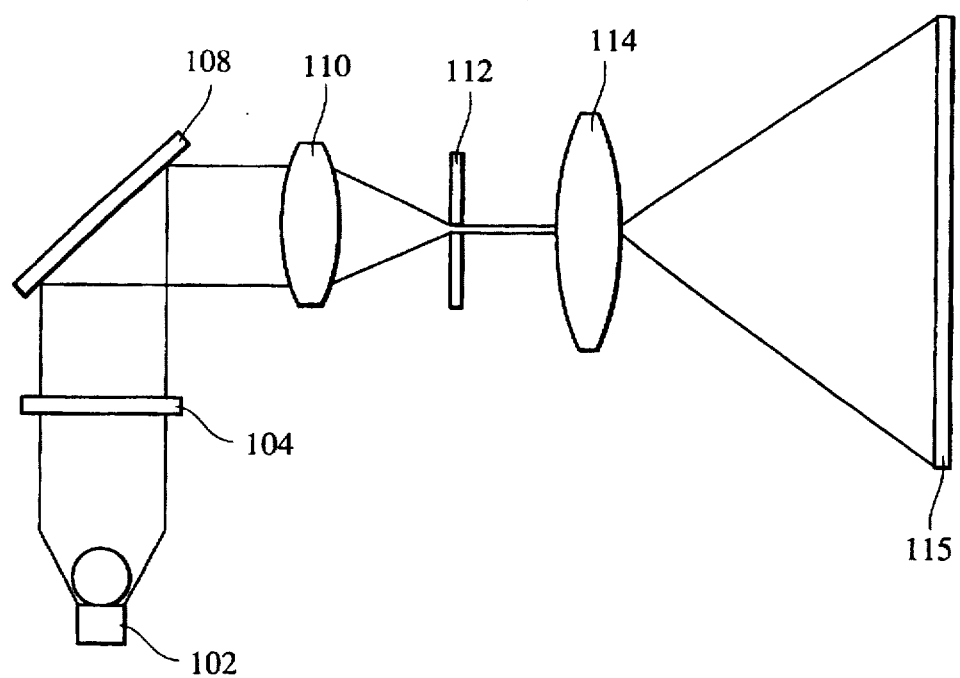

Example 2 describes a projector in which a liquid crystal panel according to the present invention and an enlargement optical system are combined. FIG. 11A illustrates a projector for color display, while FIG. 11B illustrates a projector for monochromatic display. Each of the projectors has a reflector and a projection light source, 102, in which the reflector collimates light emitted by the light source, an infrared-elimination filter 104, color filters 105 (color display only), a liquid crystal panel 108, a lens 110, a pinhole 112, a projection lens 114, and a screen 115. A small metal halide lamp or a tungsten halogen lamp having a size of approximately 1 mm may be used as the light source. Since a conventional light source requires a power of 300 to 400 W to enable bright display, glass parts surrounding the light source lose transparency, and the size of the light source is approximately 5 or 6 mm to 10 mm. Accordingly, the efficiency of utilizing light decreases, and the life of the light source itself becomes short. Also a power supply for such high power of 300 to 400 W is large, and lacks portability due to its heavy weight. However, in this example the size of the light source is reduced to approximately 1 mm, and enables the power consumption to decrease to ½ to ⅓, or smaller, that of a conventional light source. Therefore, the above problems associated with a conventional light source can be solved.

The infrared-elimination filter 104 eliminates unnecessary light impinging on the liquid crystal panel 108 to prevent the panel 108 from being unnecessarily heated by infrared rays. The color filters 105 can be simply produced at low cost because they comprise the respective colors of red, green and blue, and are not "on-chip" type. The enlargement optical system for color display shown in FIG. 11A can be changed to that for monochrome display. The color filter 105 and the infrared-elimination filter 104 can be switched by sliding each in a direction shown by an arrow 106. In this example, the liquid crystal panel 108 is positioned where a mirror should be conventionally positioned. This arrangement can omit the mirror and can reduce the number of components, and the efficiency of utilizing light becomes enhanced by several percent. In the lens 110 and the pinhole 112 a schlieren optical system is incorporated. An image is formed on the screen 115 by the projection lens 114.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An active matrix liquid crystal display device comprising:
    a semiconductor substrate on which a plurality of pixels are arranged at positions determined by a plurality of data bus lines and a plurality of scanning bus lines, each of said pixels comprising a pixel transistor and a pixel electrode, each said pixel transistor being located adjacent a respective pixel electrode, between said semiconductor substrate and the respective pixel electrode;
    a counter substrate opposite said plurality of pixel electrodes;
    a liquid crystal material provided between said semiconductor substrate and said counter substrate; and
    a semiconductor region formed between said pixel transistors and said semiconductor substrate, an insulating film provided between said pixel transistors and said semiconductor region, said semiconductor region having a conductivity opposite that of said semiconductor substrate, wherein said semiconductor region has an electric potential which is variable.

2. An active matrix liquid crystal display device according to claim 1, wherein said semiconductor region comprises a plurality of subregions connected with one another.

3. An active matrix liquid crystal display device according to claim 2, wherein said semiconductor region comprises a primary subregion and a secondary subregion formed in a part of said primary subregion, wherein said secondary subregion has an impurity concentration higher than that of said primary subregion.

4. An active matrix liquid crystal display device according to claim 3, wherein said secondary subregion and said primary subregion have the same conductivity.

5. An active matrix liquid crystal display device according to claim 1, wherein said semiconductor region comprises a primary subregion and a secondary subregion formed in a part of said primary subregion, wherein said secondary subregion has an impurity concentration higher than that of said primary subregion.

6. An active matrix liquid crystal display device according to claim 5, wherein said secondary subregion and said primary subregion have the same conductivity.

7. An active matrix liquid crystal display device according to claim 1, wherein said semiconductor substrate comprises an image display portion on which said pixel transistors, said pixel electrodes, and said semiconductor region, are provided, and further comprises a peripheral driving circuit portion for driving said image display portion, and wherein said semiconductor region is not connected to said peripheral driving circuit portion.

8. An active matrix liquid crystal display device according to claim 1, wherein said semiconductor region comprises plural subregions aligned in a direction parallel to said plurality of scanning bus lines, and separated from one another in a direction perpendicular to said plurality of scanning bus lines.

9. An active matrix liquid crystal display device according to claim 8, wherein said plural subregions are connected to said plurality of scanning bus lines.

10. An active matrix liquid crystal display device according to claim 9, wherein high concentration impurity regions connect said plural subregions to said plurality of scanning bus lines.

11. An active matrix liquid crystal display device according to claim 8, wherein said plural subregions are connected to said plurality of scanning bus lines in each of said plurality of pixels.

12. An active matrix liquid crystal display device according to claim 11, wherein high concentration impurity regions connect said plural subregions to said plurality of scanning bus lines.

13. An active matrix liquid crystal display device according to claim 8, wherein said plural subregions are connected to said plurality of scanning bus lines in each of a predetermined plurality of pixels.

14. An active matrix liquid crystal display device according to claim 13, wherein high concentration impurity regions connect said plural subregions to said plurality of scanning bus lines.

15. An active matrix liquid crystal display device according to claim 1, wherein said semiconductor region comprises plural subregions connected to said plurality of scanning bus lines for each of a predetermined plurality of pixels.

16. An active matrix liquid crystal display device according to claim 15, wherein high concentration impurity regions connect said plural subregions to said plurality of scanning bus lines.

17. An active matrix liquid crystal display device according to claim 1, wherein said semiconductor region comprises plural subregions connected to respective scanning bus lines in each of said plurality of pixels.

18. An active matrix liquid crystal display device according to claim 17, wherein high concentration impurity regions connect said plural subregions to said plurality of scanning bus lines.

19. An active matrix liquid crystal display device according to claim 1, wherein said plural subregions are connected to said plurality of scanning bus lines.

20. An active matrix liquid crystal display device according to claim 19, wherein high concentration impurity regions connect said plural subregions to said plurality of scanning bus lines.

* * * * *